United States Patent [19]

Wilmarth

[11] 4,343,084
[45] Aug. 10, 1982

[54] METHOD FOR MAKING PRINTED CIRCUIT BOARDS WITH CONNECTOR TERMINALS

[75] Inventor: Paul C. Wilmarth, Nobelesville, Ind.

[73] Assignee: RCA Corporation, New York, N.Y.

[21] Appl. No.: 254,536

[22] Filed: Apr. 15, 1981

Related U.S. Application Data

[62] Division of Ser. No. 115,361, Feb. 8, 1980, abandoned.

[51] Int. Cl.³ .............................................. H05K 3/00
[52] U.S. Cl. ...................................... 29/843; 29/842; 29/412; 29/413
[58] Field of Search .................. 29/846, 847, 842–844, 29/830, 412, 413; 339/17 LM, 17 M, 17 N, 17 C, 4

[56] References Cited

U.S. PATENT DOCUMENTS

| | | | |
|---|---|---|---|
| 2,740,097 | 3/1956 | Edelman et al. | 339/4 X |
| 3,021,589 | 2/1962 | Weller . | |
| 3,199,059 | 8/1965 | Masse et al. | 339/17 LM X |
| 3,780,431 | 12/1973 | Feeney . | |
| 4,216,523 | 8/1980 | Harford | 361/393 |

FOREIGN PATENT DOCUMENTS

| | | | |
|---|---|---|---|
| 1091631 | 10/1960 | Fed. Rep. of Germany | 339/4 |
| 1060004 | | Fed. Rep. of Germany. | |
| 840762 | 7/1960 | United Kingdom | 361/413 |
| 2005084 | 4/1979 | United Kingdom | 339/17 M |

OTHER PUBLICATIONS

IBM Tech. Discl. Bull., vol. 8, No. 11, Apr. 1966, p. 1485 by Vaughan.

*Primary Examiner*—Francis S. Husar
*Assistant Examiner*—Carl J. Arbes
*Attorney, Agent, or Firm*—Paul J. Rasmussen; William H. Meagher; W. Brinton Yorks, Jr.

[57] ABSTRACT

Two printed circuit boards are provided, each having a row of metallic pads located along an edge. The pads are spaced along the edge so that, when the boards are aligned with the two edges opposing each other, every pad in the row of one board is opposite a pad of the row of the opposing board. Each pad has a drilled center hole suitable for the insertion of a wire. The boards are opposed and spaced apart, and jumper wires are inserted to connect each pair of opposing pad holes. The jumper wires are inserted into the holes from the opposite sides of the pads and the ends of the jumpers are soldered to the pads. The jumper wires are then cut at points intermediate the two boards to provide a row of conductive mounting terminals along an edge of each board.

6 Claims, 4 Drawing Figures

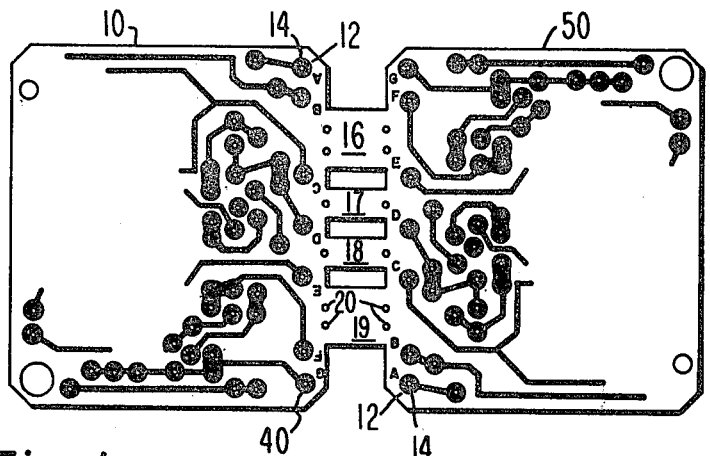
Fig. 1
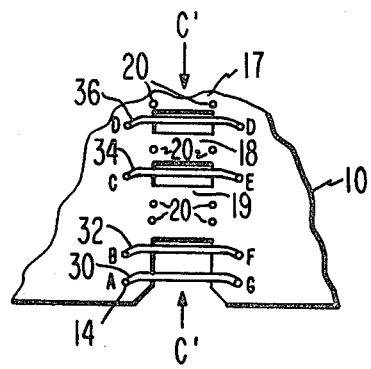
Fig. 2
Fig. 3
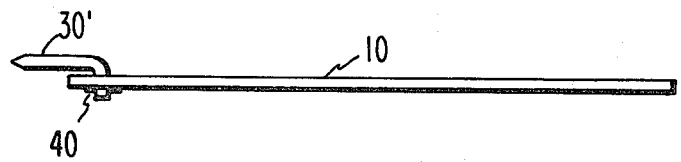

METHOD FOR MAKING PRINTED CIRCUIT BOARDS WITH CONNECTOR TERMINALS

This is a division of application Ser. No. 115,361, filed Feb. 8, 1980, now abandoned.

This invention relates to printed circuit boards for electronic instruments which include connector terminals.

Printed circuit boards, such as those commonly used in electronic instruments such as television receivers, often require provision for connections to electronic components and devices remotely located from the printed circuit boards. One common technique used to provide this printed circuit board interfacing is the provision of a row of terminals on the board, which may be plugged into a connector to complete electrical connections to external components. Such a row of terminals may be soldered along the edge of and parallel to the surface of the printed circuit board. In this configuration, the terminals can function not only as electrical connectors, but also as mounting support for the board when plugged into a rigidly mounted socket.

Printed circuit board terminals which serve this dual purpose are, unfortunately, often relatively expensive. Even when purchased in quantity, such terminals can increase the cost of a printed circuit board by one cent per terminal. Accordingly, it is desirable to provide terminals for a printed circuit board which perform the dual functions of electrical connection and mounting support, and are also relatively inexpensive and easy to manufacture.

In accordance with the principles of the present invention, two printed circuit boards, having a like number of perforated foil conductors located along an edge of the board are aligned with the foil conductor edges facing each other and separated by a small distance. The perforated foil conductors are of equal number on each board, and arranged to oppose each other in a mirror image relationship. Wires are inserted in the perforations with opposite ends of each wire located in opposing perforations of each board. The wires are soldered to the foil conductors and then cut along a line parallel to and intermediate to the two aligned edges. Each board then has a row of wire terminals which serve as conductors and provide mounting support, at a cost much less than that of conventional terminal connectors.

In accordance with a further aspect of the present invention, identical printed circuit boards are produced on a single piece of board material in a mirror image configuration, with perforated foil conductors for terminals opposing each other. The two opposing boards are spaced apart by some of the board material, some of which is cut away where the foil conductors oppose each other. Wire jumpers are inserted and soldered into opposing perforated foil conductors. A cutting tool then cuts the jumpers in the middle, approaching the jumpers from above and below the boards through the cut-away portions of the board material. Cutting the terminals in this manner does not leave wedge-shaped tips on the cut jumper wires, but creates pointed terminals which may readily be inserted in a socket, such as a matching row of perforations in another printed circuit board.

In the drawings:

FIG. 1 illustrates two printed circuit boards constructed and aligned for the insertion of terminal wires in accordance with the principles of the present invention;

FIG. 2 is a detailed illustration of a portion of the opposite sides of the printed circuit boards of FIG. 1 including inserted terminal wires;

FIG. 3 is a side view of one of the printed circuit boards of FIGS. 1 and 2 including a connector terminal.

Figure 4:
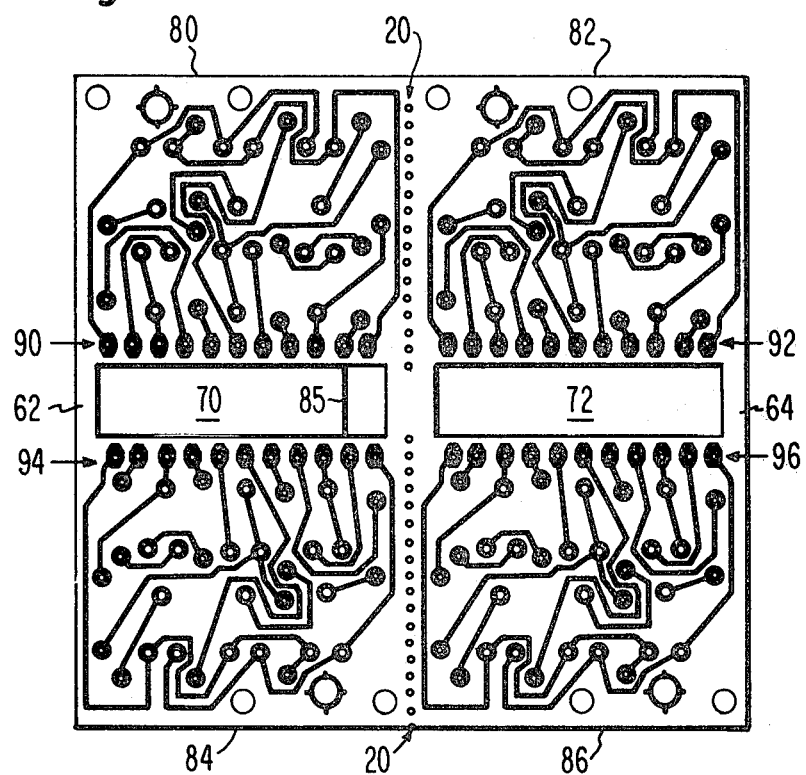
FIG. 4 illustrates four printed circuit boards constructed and aligned for the insertion of terminal wires.

Referring to FIG. 1, two printed circuit boards 10 and 50 are illustrated, connected by sections 16, 17, 18 and 19 of board material. The board material is conventional fiberglass or other nonconductive material. A pattern of metallic foil conductors is photographically etched on the board surfaces shown in the FIGURE. In the embodiments shown in this application, the printed circuit boards are single-clad boards (i.e., with foil conductors on only one side), although the present invention is equally applicable to double-clad boards.

Etched along the edges of the boards which are connected by sections 16–19 are a number of foil pads located at positions A, B, C, D, E, F and G of each board. Three of these pads are indicated by reference numerals 12, 12' and 40. The boards 10 and 50 are etched with identical foil patterns with pad positions A–G arranged so that each pad on one of the boards is aligned with a pad on the other board. The foil pads are to be connected to mounting terminals which plug into a socket to support the board and provide electrical connections to and from the board. It may be seen that when the boards are properly aligned, pad A of one board opposes pad G of the other board, pad B opposes pad F, etc. Each pad is drilled to provide a center hole for the insertion of a mounting terminal, as shown at 14 and 14'. Holes 20 are drilled at the edges of the board where sections 16–19 meet the edges of each board.

FIG. 2 shows the lower portion of boards 10 and 50 from the reverse side of the boards. Twenty gauge jumper wires 30, 32, 34 and 36 are shown inserted in the holes of opposing foil pad locations. Jumper wire 30 connects location A of board 50 with location G of board 10, jumper wire 32 connects location B of board 50 with location F of board 10, etc. Each jumper wire bridges a space between the board edges, the spaces being separated by sections 19, 18, 17 and 16.

After the jumper wires are inserted in place, the ends of the jumper wires which extend through the foil pad holes are soldered to the pads on the surfaces of the boards shown in FIG. 1. The jumper wires are then cut through the middle as indicated by arrows C' of FIG. 2. The cutting mechanism engages the wires from both the top and bottom of the boards by passing through the openings on either side of the respective sections 16, 17, 18 and 19. Cutting the jumper wires in this manner ensures that the cut ends will have rounded or pointed ends, rather than rough wedge-shaped ends that would be produced if the wires were cut from only one direction. The cutting mechanism also separates the two boards by breaking off sections 16, 17, 18 and 19 along the edges of the boards. Holes 20 ensure that the sections will be cleanly broken at the edges of the boards.

A side view of finished board 10 is shown in FIG. 3. The board 10 includes a mounting terminal 30' which comprises approximately half of the original jumper wire 30. The mounting terminal 30' has a rounded or pointed tip, which permits the row of terminals to be easily engaged in a socket. The mounting terminal 30' is soldered to foil pad 40 on the underside of the board. The board 10 may be conveniently mounted perpendicular to another printed circuit board, in which the socket comprises a row of holes spaced apart by the same distances as the mounting terminal spacings of board 10. The board 10 may be secured in place and electrically connected to the socket board by soldering the mounting terminals to foil pads on the opposite side of the socket board from the location of board 10.

Using the principles of the present invention, multiple boards with mounting terminals may be constructed from a simple piece of printed circuit board material. In FIG. 4, four printed circuit boards 80, 82, 84 and 86 have been etched on a single piece of board material, joined at holes 20 and by sections 60, 62 and 64. The sections 60, 62 and 64 are separated by spaces 70 and 72, through which the cutting mechanism may engage inserted jumpers, such as the one shown at 85. The jumper wires are inserted to join opposing pad rows 90 and 94, and 92 and 96, respectively. Each pad row contains eleven evenly-spaced pads; however, the pads may be unevenly spaced, as long as they oppose each other, as shown in FIG. 1. Moreover, the opposing boards may contain differently etched patterns, as long as the pads on the opposing boards are of the same number and each pad on one board opposes a pad on the opposite board.

As in the case of the boards of FIG. 1, the cutting mechanism may also separate the opposing boards of FIG. 4 by breaking off the sections 60, 62 and 64. Boards 80 and 82, and 84 and 86 may then be separated by breaking the respective board combinations apart along the rows of holes 20.

Printed circuit boards including mounting terminals constructed in accordance with the present invention have been built to determine their cost-effectiveness. It was found that, using an automated jumper wire insertion machine and cutting mechanism, the cost per jumper was approximatey 0.24 cents at 1980 labor rates. This results in a cost of 0.12 cents per mounting terminal, since each terminal comprises half of a jumper wire. This compares favorably with the 1980 cost of installing conventional mounting terminals of one cent per terminal.

What is claimed is:

1. A method of manufacturing mounting terminals for two printed circuit boards comprising the steps of:
    (a) aligning said two boards in a spaced apart relationship in the same plane, wherein each opposing edge contains a row of metallic pads located near the edge on the surface of the board, each pad having a hole for receiving a wire, and said alignment causing respective pads of one board to be opposite respective pads on the other board;
    (b) inserting jumper wires through said holes in said pads from the sides of said boards opposite said pad side so as to connect opposing pads;
    (c) soldering said jumper wires to said pads; and
    (d) cutting said jumper wires at locations intermediate said spaced apart boards to form a row of wire terminals extending beyond said opposing edges of each of said printed circuit boards.

2. A method of manufacturing printed circuit boards comprising the steps of:
    (a) forming two printed circuit board regions on a single piece of printed circuit board material, said two regions have respective edges spaced apart and connected to each other by sections of printed circuit board material, and each of said respective edges having a row of perforated metallic pads located on each of said regions near said edges and aligned so that respective perforated metallic pads on one of said regions oppose respective perforated metallic pads on the other region;
    (b) inserting the respective ends of respective ones of a plurality of wires through respective ones of said opposing perforated metallic pads so as to interconnect each pair of opposing pads;
    (c) soldering said wires to said pads;
    (d) cutting said wires at points intermediate said spaced apart edges; and
    (e) separating said two board regions by breaking said connected regions at the intersections of said sections and said region edges to form two printed circuit boards with wire terminals extending beyond said edges.

3. The method of claim 2, wherein steps (a) and (b) comprise the steps of:
    (a) forming two printed circuit board regions on a single piece of printed circuit board material, said two regions having respective edges spaced apart and connected to each other by sections of printed circuit board material, said sections being separated by spaces in said printed circuit board material, and each of said respective edges having a row of perforated metallic pads located on each of said regions near said edges and aligned so that each perforated metallic pad on one of said regions opposes a perforated metallic pad on the other region with a portion of one of said spaces intervening between each opposing pad pair; and
    (b) inserting the respective ends of respective ones of a plurality of wires through respective ones of said opposing perforated metallic pads so as to interconnect each pair of opposing pads and to bridge said intervening space portions.

4. The method of claims 2 or 3, further comprising a step preceding step (e), which comprises:
    (f) drilling holes at ones of said intersections of said sections and said region edges.

5. The method of claims 2 or 3, wherein steps (d) and (e) comprise the step of:
    (d and e) cutting said wires at points intermediate said spaced apart edges and separating said two board regions by breaking said connected regions at the intersections of said sections and said region edges in a continuous operational step.

6. The method of claim 5, wherein step (d) comprises the step of:
    (d) cutting said wire at points intermediate said spaced apart edges with a cutting tool having cutting surfaces which approach said wires from opposite directions.

* * * * *